US007656920B2

(12) United States Patent
Shigihara et al.

(10) Patent No.: US 7,656,920 B2
(45) Date of Patent: Feb. 2, 2010

(54) SEMICONDUCTOR LASER DEVICE

(75) Inventors: Kimio Shigihara, Tokyo (JP);
Kazushige Kawasaki, Tokyo (JP);
Kenichi Ono, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 384 days.

(21) Appl. No.: 11/284,907

(22) Filed: Nov. 23, 2005

(65) Prior Publication Data

US 2006/0215717 A1      Sep. 28, 2006

(30) Foreign Application Priority Data

Mar. 23, 2005     (JP) .............................. 2005-083149

(51) Int. Cl.
*H01S 5/00*          (2006.01)
(52) U.S. Cl. ................................. 372/45.011
(58) Field of Classification Search ............. 372/45.011
See application file for complete search history.

(56) References Cited

U.S. PATENT DOCUMENTS

| | | | | |
|---|---|---|---|---|
| 5,396,508 A | * | 3/1995 | Bour et al. | 372/27 |
| 5,412,678 A | * | 5/1995 | Treat et al. | 372/45.01 |
| 5,438,584 A | * | 8/1995 | Paoli et al. | 372/45.01 |
| 5,465,266 A | * | 11/1995 | Bour et al. | 372/46.01 |
| 5,764,669 A | * | 6/1998 | Nagai | 372/46.015 |
| 5,784,399 A | * | 7/1998 | Sun | 372/50.11 |
| 7,072,374 B2 | * | 7/2006 | Matsumura | 372/46.01 |
| 2002/0097662 A1 | * | 7/2002 | Fujii | 369/121 |
| 2003/0007527 A1 | * | 1/2003 | Tsukiji et al. | 372/46 |
| 2004/0057487 A1 | * | 3/2004 | Nomura et al. | 372/46 |
| 2005/0041709 A1 | * | 2/2005 | Anikitchev et al. | 372/44 |
| 2005/0141579 A1 | * | 6/2005 | Yamane et al. | 372/46 |
| 2005/0201439 A1 | * | 9/2005 | Horie | 372/43.01 |

OTHER PUBLICATIONS

Kim et al., "High-Power 0.81 μm Tensile Strained GaAsP/InGaP Diode Lasers", Feb. 2003, Journal of the Korean Physical Society, 42, S293-S296.*
Chuang, "Physics of Optoelectronic Devices", 1995, A Wiley-Interscience Publication, ISBN 0-471-10939-8, 445.*
Tansu et al., "High-Performance Strain-Compensated InGaAs-GaAsP-GaAs (λ=1.17μm) Quantum-Well Diode Lasers", Mar. 2001, IEEE, Photonics Technology Letters, vol. 13, No. 3, 179-181.*
Wade et al., "6.1 W continuous wave front-facet power from Al-free active region (λ=805 nm) diode lasers", Jan. 5, 1998, Appl. Phys. Lett., 72 (1), 4-6.*
Wade et al., "8.8W CW power from broad-waveguide Al-free active region (λ=805 nm) diode lasers",May 28, 1998, IEEE Electronics Letters, 34 (11), 1100-1101.*
Wade et al., "High continuous wave power, 0.8 μm-band, Al-free active-region diode lasers", Jan. 13, 1997, Appl. Phys. Lett., 70 (2), 149-151.*
K. Shigihara et al. "High-Power 980-nm Ridge Waveguide Laser Diodes Including an Asymmetrically Expanded Optical Field Normal to the Active Layer", IEEE Journal of Quantum Electronics, pp. 1081-1088, vol. 38, No. 8, Aug. 2002.

* cited by examiner

*Primary Examiner*—Minsun Harvey
*Assistant Examiner*—Joshua King
(74) *Attorney, Agent, or Firm*—Leydig, Voit & Mayer, Ltd.

(57) ABSTRACT

A semiconductor laser device producing light having a TE-polarized component suitable for practical use (i.e., light having TE-polarized light intensity sufficiently high for practical use). A semiconductor laser device includes a GaAsP active layer, InGaP guide layers, and AlGaInP cladding layers. The GaAsP active layer emits light. The GaAsP active layer is interposed between the InGaP guide layers. The InGaP guide layers and GaAsP active layer are interposed between the AlGaInP cladding layers. Polarization ratio, which is a ratio of light intensity of TM-polarized light to light intensity of TE-polarized light, of the light produced by the semiconductor laser device is less than 2.3.

8 Claims, 9 Drawing Sheets

200

F I G. 5
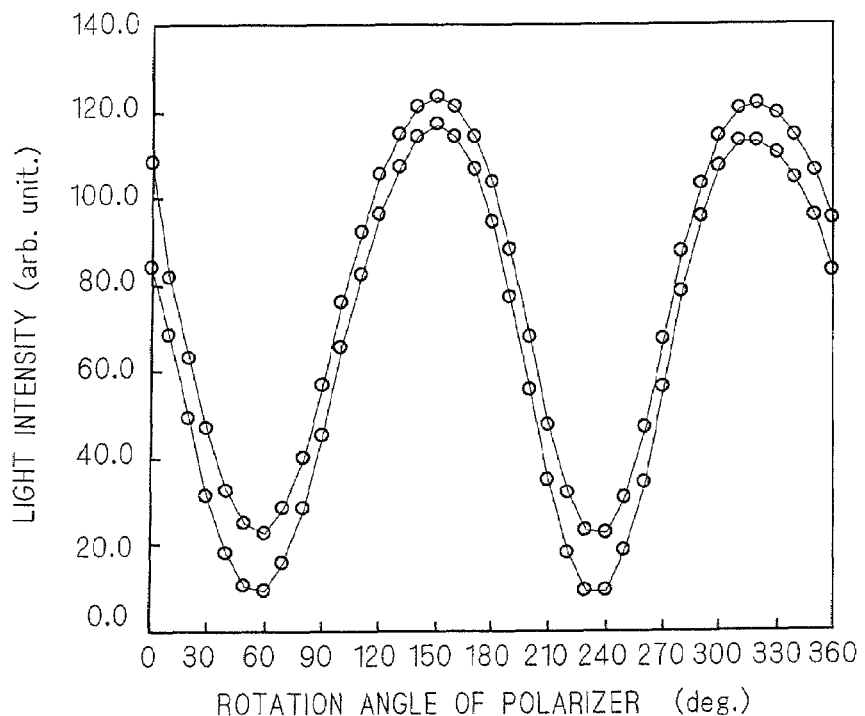

F I G . 8
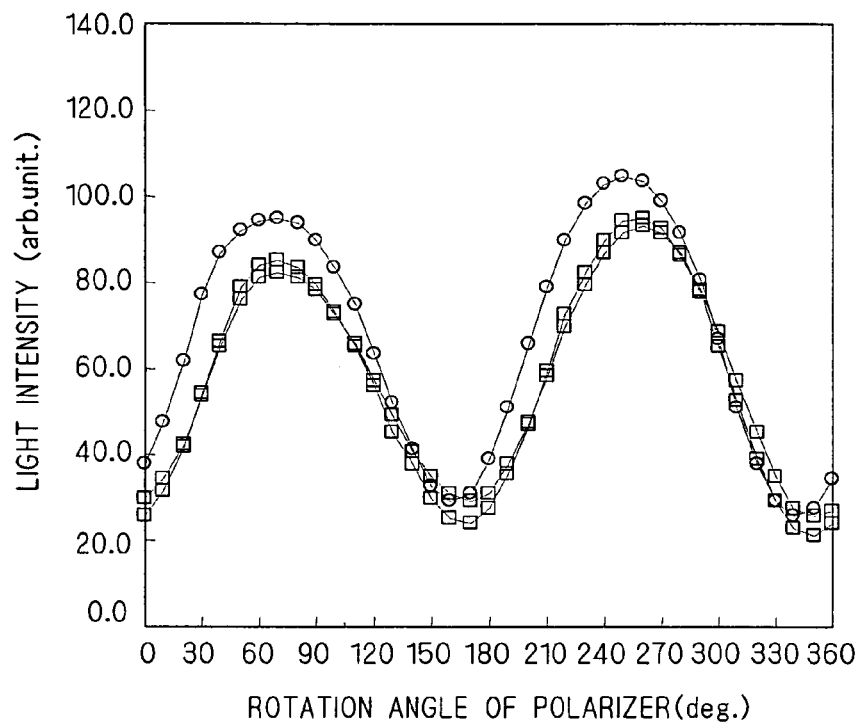
F I G . 9
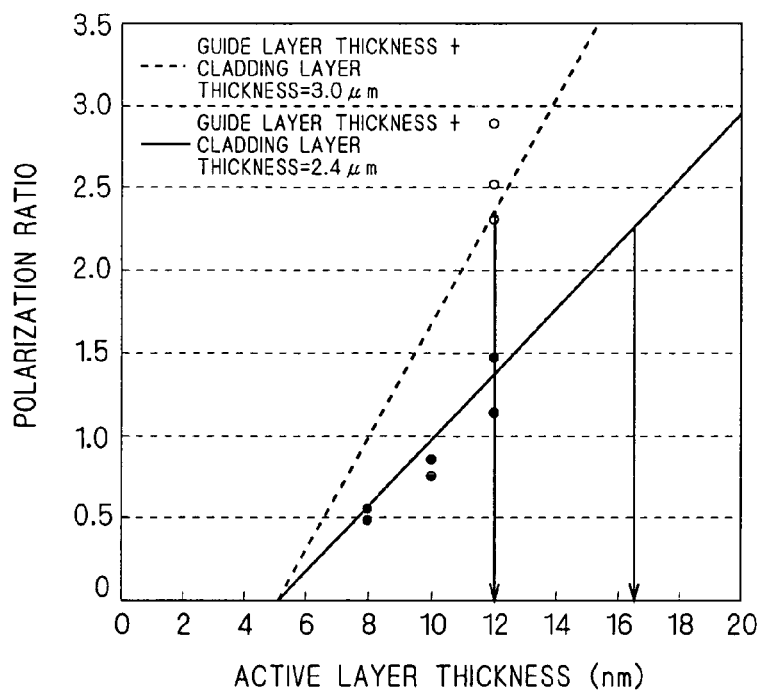

SEMICONDUCTOR LASER DEVICE

BACKGROUND OF THE INVENTION

1. Field of the Invention

The present invention relates to a semiconductor laser device, and particularly to a semiconductor laser device capable of oscillating light that contains TE-polarized light of higher intensity.

2. Description of the Background Art

Semiconductor laser devices that oscillate in the TM (Transverse Magnetic) polarization (polarized light having an electric field vector normal to the active layer) include that described in U.S. Pat. No. 5,438,584 (hereinafter referred to as Patent Document 1). The semiconductor laser device of the Patent Document 1 has a structure of layers stacked between an n-electrode and a p-electrode as shown below.

That is to say, the stacked layers include an n-electrode, an n-GaAs substrate, an n-AlGaAs cladding layer, an $(AlGa)_{0.5}In_{0.5}P$ guide layer, a GaAsP active layer, an $(AlGa)_{0.5}In_{0.5}P$ guide layer, a p-AlGaAs cladding layer, an n-GaAs current confining layer, a p-GaAs contact layer, and a p-electrode.

The GaAsP active layer has tensile strain and the GaAsP active layer oscillates TM-polarized light of 600 nm or more.

Now, it is difficult to produce rods or optical fibers that are specially adapted for the TM-polarization. However, passing TM-polarized light into rods or optical fibers adapted for the TE (Transverse Electric) polarization (polarized light having an electric field vector parallel to the active layer) results in deteriorated excitation efficiency.

A device that changes the polarizing angle (i.e., a device that transforms TM-polarized light into TE-polarized light) may be interposed between a semiconductor laser device emitting TM-polarized light and a rod etc., but this involves complicated device structure.

Because of these reasons, semiconductor laser devices that emit TE-polarized light are more practical than semiconductor laser devices that emit TM-polarized light. Also, it is known that increasing the light intensity of TE-polarized light tends to enhance the practicability of the semiconductor laser devices.

A semiconductor laser device capable of emitting light including TE-polarized light of high intensity is described in K. Shigihara et al., "High Power 980 nm Ridge Waveguide Laser Diodes Consisting of Expanded Optical Field Normal to The Active Layer", IEEE J. Quantum Electron, Vol. 38, No. 8, pp. 1081-1088, August 2002 (which is hereinafter referred to as Non-Patent Document 1).

As above, there are conventional semiconductor laser devices that are capable of emitting light including TE-polarized light of high intensity. However, there are demands for semiconductor laser devices that adopt other structures and are capable of emitting light having such high TE-polarized light intensity as to be suitable for practical use.

SUMMARY OF THE INVENTION

An object of the present invention is to devise and provide a semiconductor laser device that adopts a different structure from existing semiconductor laser devices and that is capable of oscillating light having such high TE-polarized light intensity as to be suitable for practical use.

According to the present invention, a semiconductor laser device includes a GaAsP active layer, InGaP guide layers, and AlGaInP cladding layers. The GaAsP active layer is a portion that emits light. The GaAsP active layer is interposed between the InGaP guide layers. The InGaP guide layers are interposed between the AlGaInP cladding layers. A polarization ratio, which is a ratio of a light intensity of TM-polarized light to a light intensity of TE-polarized light, is less than 2.3.

Thus, a semiconductor laser device is provided that adopts a different structure from existing semiconductor laser devices and that is capable of oscillating light having such high TE-polarized light intensity as to be suitable for practical use (i.e., light having such a TE-polarized component as to be suitable for practical use).

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 7 are diagrams showing the results of experiments on polarization characteristics of the semiconductor laser device according to the first preferred embodiment;

FIG. 8 is a diagram showing the results of an experiment on a polarization characteristic that were obtained with thicker cladding layers;

FIG. 9 is a diagram showing a relation between active layer thickness and polarization ratio;

DESCRIPTION OF THE PREFERRED EMBODIMENTS

Figure 1:
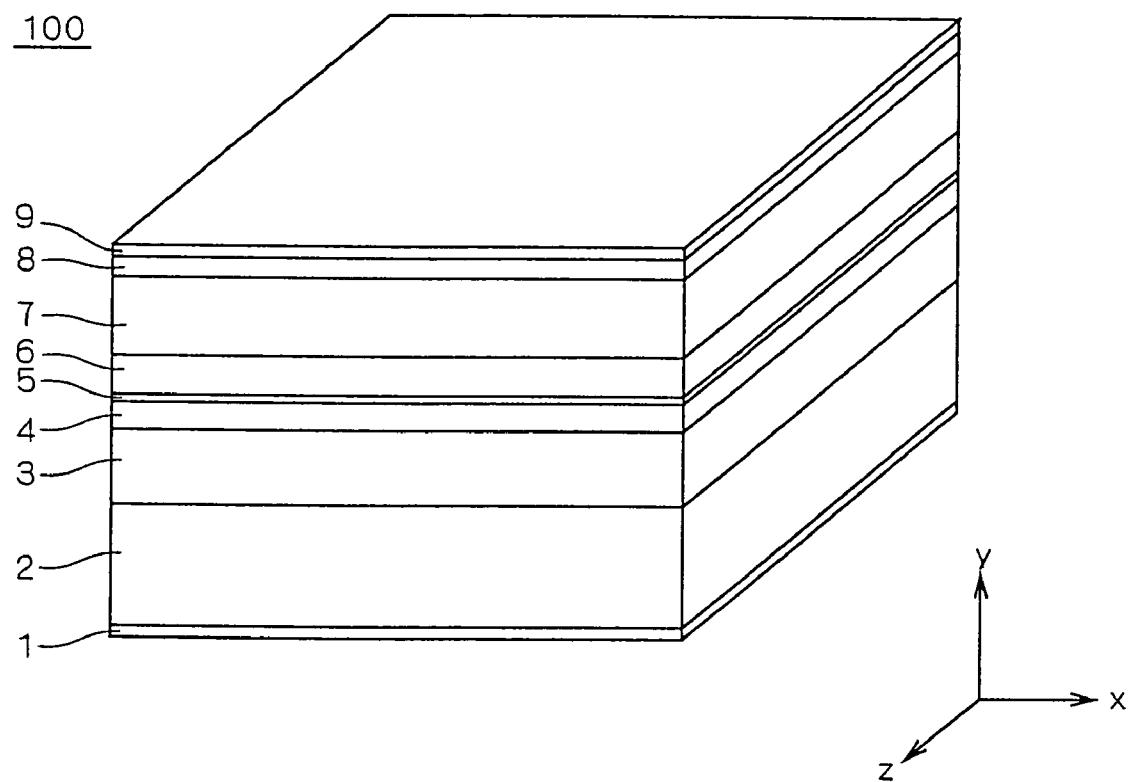
FIG. 1 is a cross-sectional perspective view illustrating the structure of a semiconductor laser device according to a first preferred embodiment.

The present invention will now be specifically described referring to the drawings that illustrate the preferred embodiments.

First Preferred Embodiment

FIG. 1 is a cross-sectional perspective view illustrating the structure of a semiconductor laser device according to a first preferred embodiment.

As shown in FIG. 1, the semiconductor laser device 100 of the first preferred embodiment includes a structure of layers stacked between an n-electrode and a p-electrode as shown below.

That is to say, the stacked-layer structure includes an n-electrode 1, an n-type GaAs substrate 2, an n-type $(Al_{0.3}Ga_{0.7})_{0.5}In_{0.5}P$ cladding layer 3, an undoped $In_{0.49}Ga_{0.51}P$ guide layer 4, an undoped $GaAs_{0.88}P_{0.12}$ active layer 5, an undoped $In_{0.49}Ga_{0.51}P$ guide layer 6, a p-type $(Al_{0.3}Ga_{0.7})_{0.5}In_{0.5}P$ cladding layer 7, a p-type GaAs contact layer 8, and a p-electrode 9. The composition ratios are not shown in the description below.

As is seen from FIG. 1, the GaAsP active layer 5 is interposed between the InGaP guide layers 4 and 6. Also, the InGaP guide layers 4 and 6 are interposed between the AlGaInP cladding layers 3 and 7.

Now, the surface orientation of the GaAs substrate 2 (particularly, the surface on which the AlGaInP cladding layer 3 is formed) has an off-angle of approximately 10° with respect to (100) plane. Therefore, the AlGaInP cladding layer 3 and the like, which are obtained by crystal growth, provide good crystallinity.

The GaAsP active layer 5 is a layer that emits light. The InGaP guide layers 4 and 6 have larger bandgap than the GaAsP active layer 5. The AlGaInP cladding layers 3 and 7 have larger bandgap than the InGaP guide layers 4 and 6.

Now, with the semiconductor laser device 100 constructed as above, polarization characteristics of light emitted from the semiconductor laser device 100 were examined under the conditions shown below.

That is to say, the polarization characteristics of the light emitted from the semiconductor laser device 100 were examined with the InGaP guide layers 4 and 6 having a thickness of 0.5 μm and the AlGaInP cladding layers 3 and 7 having a thickness of 0.7 μm (i.e., the sum of the total thickness of the InGaP guide layers 4 and 6 and the total thickness of the AlGaInP cladding layers 3 and 7 was 2.4 μm), and with the thickness of the GaAsP active layer 5 varied to 8 nm, 10 nm, and 12 nm.

As will be revealed by experimental data shown later, the semiconductor laser device 100 constructed as above is capable of oscillating light having such high TE-polarized light intensity as to be suitable for practical use.

Figure 2:
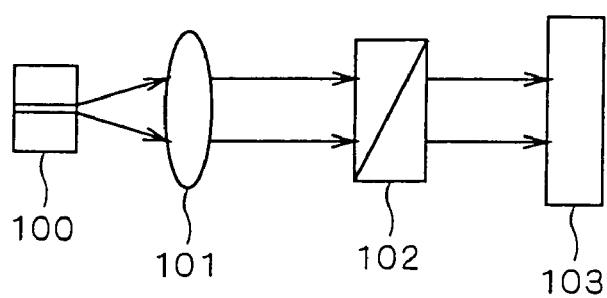
FIG. 2 is a conceptual diagram showing an experimental apparatus used to examine polarization characteristics.

In order to evaluate the polarization characteristics of light emitted from the semiconductor laser device 100, an experimental system shown in FIG. 2 was used. As shown in FIG. 2, the experimental apparatus for evaluating polarization characteristics includes a lens 101, a polarizer 102, and a photodiode 103.

Light emitted from the semiconductor laser device 100 is made parallel light by the lens 101. Then, the parallel light travels through the polarizer 102, which is rotating, and enters the photodiode 103. The light that enters the photodiode 103 is converted into current in the photodiode 103.

With the experimental apparatus shown above, the current converted by the photodiode 103 was measured. The measured results show what amounts of light are polarized in which directions, in the light emitted from the semiconductor laser device 100.

Figure 3:
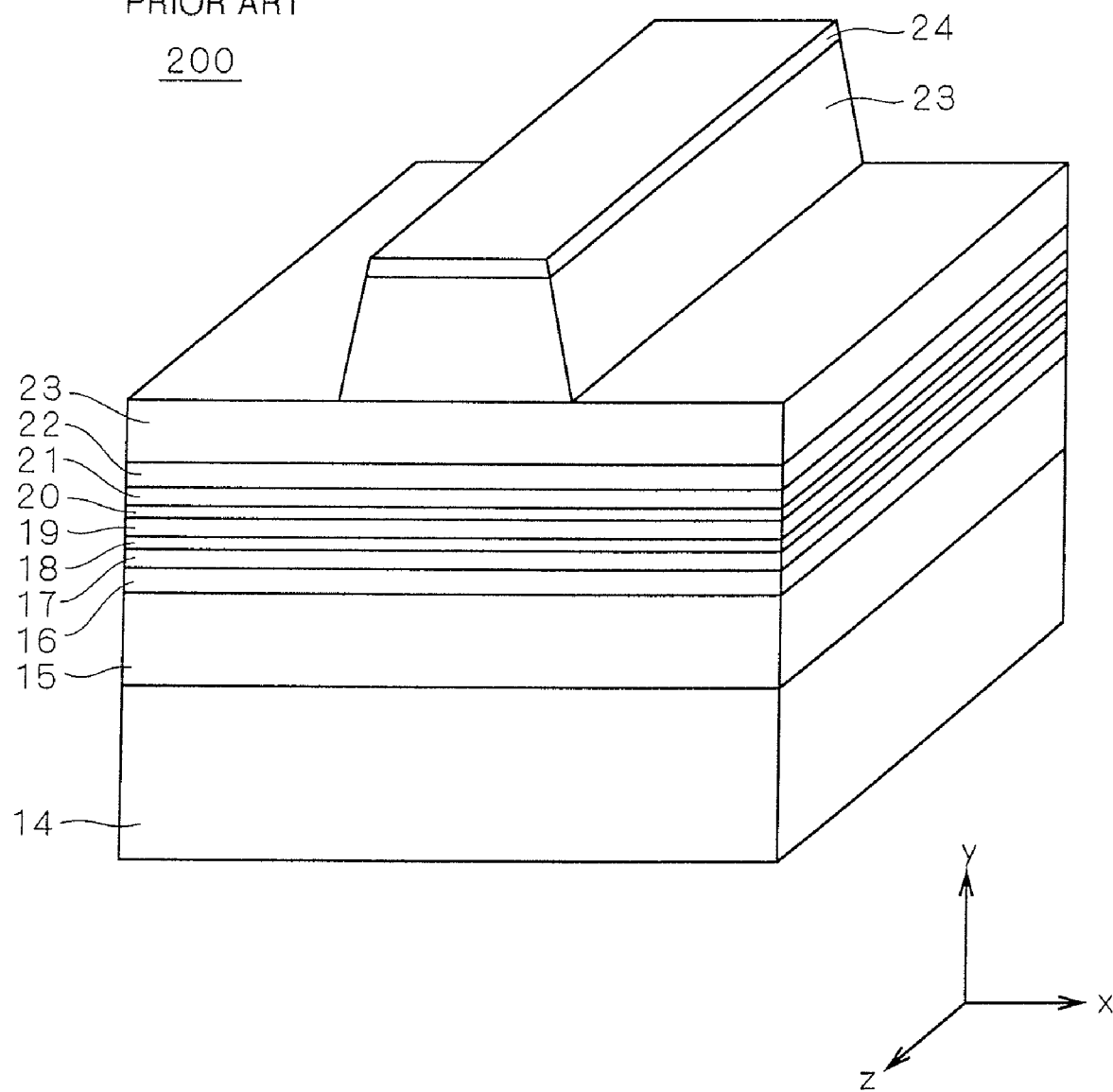
FIG. 3 is a cross-sectional perspective view showing the structure of a semiconductor laser device according to Non-Patent Document 1.

First, for comparison, an experiment was conducted with a semiconductor laser device according to the Non-Patent Document 1 of which polarization characteristic was previously known. FIG. 3 shows the semiconductor laser device 200 according to the Non-Patent Document 1. The semiconductor laser device 200 is a device for fiber amplifier excitation and outputs light of 980 nm.

As shown in FIG. 3, the semiconductor laser device 200 includes an n-type GaAs substrate 14, an n-type AlGaAs cladding layer 15, an undoped AlGaAs guide layer 16, an undoped GaAs guide layer 17, an undoped InGaAs well 18, an undoped GaAs barrier layer 19, an undoped InGaAs well 20, an undoped GaAs guide layer 21, an undoped AlGaAs guide layer 22, a p-type AlGaAs cladding layer 23, and a p-type GaAs contact layer 24.

In the semiconductor laser device 200, the active layer is formed of the InGaAs wells having a larger lattice constant than the GaAs substrate 14. Therefore the active layer undergoes compressive strain.

When the active layer is compressively strained, the semiconductor laser device oscillates TE-polarized light, as described in S. W. Corzine et al., "Theoretical gain in strained-layer quantum wells", Proceeding of SPIE, Vol. 1850, pp. 177-188, 1993 (which is hereinafter referred to as Non-Patent Document 2).

Accordingly, it is known that the semiconductor laser device 200 emits TE-polarized light.

The polarization characteristic of the semiconductor laser device 200 was measured with the experimental apparatus shown in FIG. 2. The experiment gave the results shown in FIG. 4. The experiment was done about light that travels along the z-axis direction shown in FIG. 3 from the semiconductor laser device 200.

Figure 4:
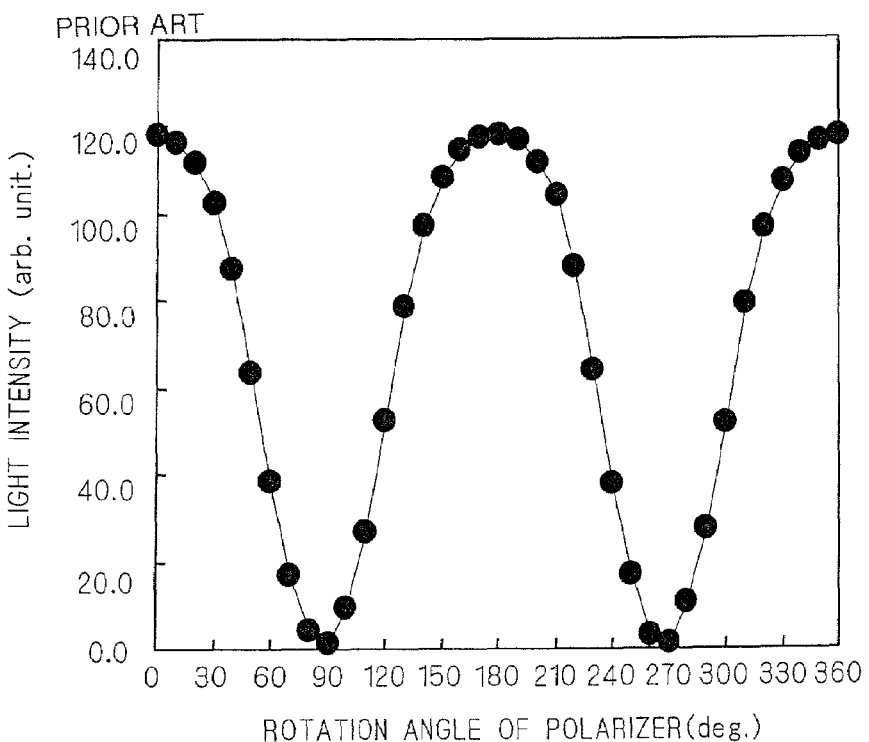
FIG. 4 is a diagram showing the results of an experiment on the polarization characteristic of the semiconductor laser device according to the Non-Patent Document 1.

FIG. 4 shows the dependence on the rotation angle of the polarizer 102 (i.e., polarization characteristic) of the light emitted when a current of 500 mA is applied to the semiconductor laser device 200. In FIG. 4, the vertical axis shows the light intensity (arb. unit) and the horizontal axis shows the rotation angle of the polarizer (deg). As shown in FIG. 4, the measurements were taken at intervals of 10° over the rotation angles from 0° to 360° of the polarizer 102.

The rotation angle of the polarizer 102 at which light polarized in the x-axis direction travels through the polarizer 102 and enters the photodiode 103 was set as 0°. Accordingly, when the rotation angle is 180°, too, light polarized in the x-axis direction travels through the polarizer 102 and enters the photodiode 103. On the other hand, when the rotation angle is 90° or 270°, light polarized in the y-axis direction travels through the polarizer 102 and enters the photodiode 103.

As can be seen from the results shown in FIG. 4, the intensity of light emitted from the semiconductor laser device 200 becomes minimum when the rotation angle of the polarizer 102 is 90° and 270°. Also, the light intensity becomes maximum when the rotation angle of the polarizer 102 is 0° and 180°.

The results of the experiment show that the light polarized in the x-direction of FIG. 3 is predominant, i.e., that the semiconductor laser device 200 oscillates TE-polarized light as considered above.

It has thus been confirmed using the experimental apparatus of FIG. 2 that the semiconductor laser device 200 of Non-Patent Document 1 has a TE polarization characteristic, and next, experiments were conducted to examine the polarization characteristic of the semiconductor laser device 100 of this preferred embodiment shown in FIG. 1. The experiments were done about the light that travels along the z-axis direction from the semiconductor laser device 100 of FIG. 1.

First, an experiment was conducted with a semiconductor laser device 100A that had layers of the thicknesses shown below.

That is, the experiment was conducted with a semiconductor laser device 100A with the AlGaInP cladding layers 3 and 7 each having a thickness of 0.7 μm (a total thickness of 1.4 μm), with the InGaP guide layers 4 and 6 each having a thickness of 0.5 μm (a total thickness of 1.0 μm), and with the GaAsP active layer 5 having a thickness of 8 nm.

That is to say, in the experiment on the semiconductor laser device 100A, the sum of the total thickness of the AlGaInP cladding layers 3 and 7 and the total thickness of the InGaP guide layers 4 and 6 was 2.4 μm and the thickness of the GaAsP active layer 5 was 8 nm; in other words, (the thickness of the GaAsP active layer 5)×{(the total thickness of the AlGaInP cladding layers 3 and 7)+(the total thickness of the InGaP guide layers 4 and 6)}=8 nm×2.4 µm=19.2 nm·µm.

A current of 500 mA was applied to the semiconductor laser device 100A having the layers of the thicknesses above, and the polarization characteristic was measured to obtain the results shown in FIG. 5.

In FIG. 5, the vertical axis shows the light intensity (arb. unit) and the horizontal axis shows the rotation angle of the polarizer (deg). As shown in FIG. 5, the measurements were taken at intervals of 10° over rotation angles from 0° to 360° of the polarizer 102. The experiment was conducted using two semiconductor laser devices 100A.

As can be seen from the results shown in FIG. 5, the intensities of light beams emitted from the semiconductor laser devices 100A become maximum when the rotation angle of the polarizer 102 is 150° and 320°. That is, the light intensities exhibit maximum values in the vicinities of 0° or 180°. This shows that the light emitted from the semiconductor laser devices 100A contains a TE-polarized component that is larger than other polarized components (particularly, than the TM-polarized component).

Now, the maximum values appear at rotation angles somewhat shifted from 0° and 180°. This means that the light emitted from the semiconductor laser devices 100A includes a TM-polarized component, though at a small ratio.

As can be clearly seen from the peak light intensities and bottom light intensities in FIG. 5, the TE-polarized component is much larger than the TM-polarized component.

Next, an experiment was conducted with a semiconductor laser device 100B having the layers of the thicknesses shown below.

That is, an experiment was conducted with a semiconductor laser device 100B with the AlGaInP cladding layers 3 and 7 each having a thickness of 0.7 µm (a total thickness of 1.4 µm), with the InGaP guide layers 4 and 6 each having a thickness of 0.5 µm (a total thickness of 1.0 µm), and with the GaAsP active layer 5 having a thickness of 10 nm.

That is to say, in the experiment on the semiconductor laser device 100B, the sum of the total thickness of the AlGaInP cladding layers 3 and 7 and the total thickness of the InGaP guide layers 4 and 6 was 2.4 µm and the thickness of the GaAsP active layer 5 was 10 nm; in other words, (the thickness of the GaAsP active layer 5)×{(the total thickness of the AlGaInP cladding layers 3 and 7)+(the total thickness of the InGaP guide layers 4 and 6)}=10 nm×2.4 µm=24.0 nm·µm.

As can be seen from comparison between the semiconductor laser device 100A and the semiconductor laser device 100B, the only difference is the thickness of the GaAsP active layer 5.

Figure 6:
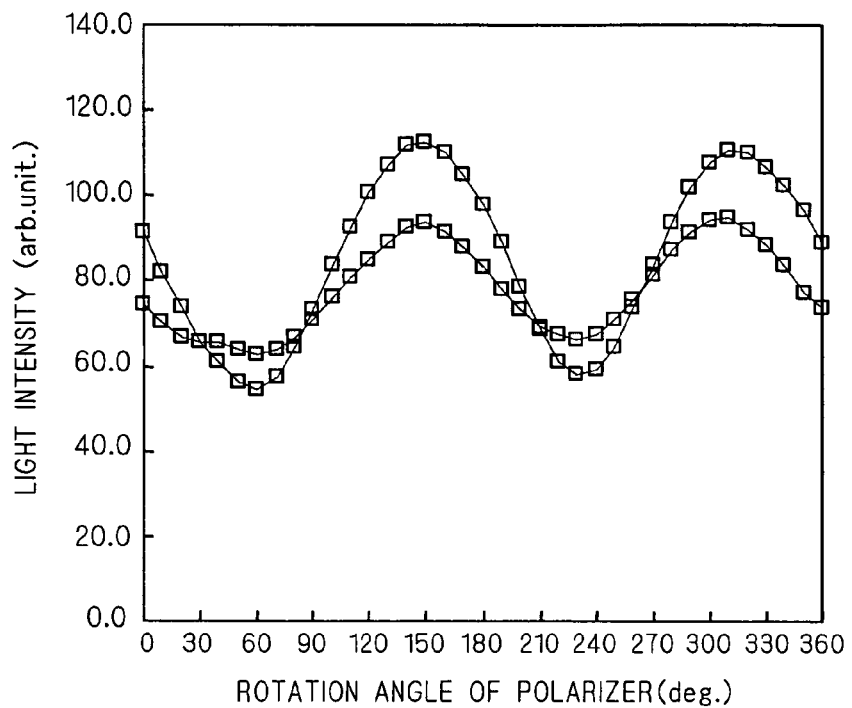

A current of 500 mA was applied to the semiconductor laser device 100B having the layers of the thicknesses above, and the polarization characteristic was measured to obtain the results shown in FIG. 6.

In FIG. 6, the vertical axis shows the light intensity (arb. unit) and the horizontal axis shows the rotation angle of the polarizer (deg). As shown in FIG. 6, the measurements were taken at intervals of 10° over rotation angles from 0° to 360° of the polarizer 102. The experiment was conducted using two semiconductor laser devices 100B.

As can be seen from the results shown in FIG. 6, the intensities of light beams emitted from the semiconductor laser devices 100B become maximum when the rotation angle of the polarizer 102 is around 150° and 320°. That is, the light intensities exhibit maximum values in the vicinities of 180° or 360° (0°). This shows that the light emitted from the semiconductor laser devices 100B contains a TE-polarized component that is larger than other polarized components (particularly, than the TM-polarized component).

Now, the maximum values appear at rotation angles somewhat shifted from 0° and 180°. As mentioned above, this means that the light emitted from the semiconductor laser devices 100B contains a TM-polarized component, though at a small ratio.

As can be seen by comparing FIGS. 5 and 6, the differences between the peak light intensities and the bottom light intensities are smaller in FIG. 6. This is because the ratio of the TM-polarized component is increased. However, as is clear from FIG. 6, the TE-polarized component is predominant over the TM-polarized component.

Next, an experiment was conducted with a semiconductor laser device 100C having layers of the thicknesses shown below.

That is, an experiment was conducted with a semiconductor laser device 100C with the AlGaInP cladding layers 3 and 7 each having a thickness of 0.7 µm (a total thickness of 1.4 µm), with the InGaP guide layers 4 and 6 each having a thickness of 0.5 µm (a total thickness of 1.0 µm), and with the GaAsP active layer 5 having a thickness of 12 nm.

That is to say, in the experiment on the semiconductor laser device 100C, the sum of the total thickness of the AlGaInP cladding layers 3 and 7 and the total thickness of the InGaP guide layers 4 and 6 was 2.4 µm and the thickness of the GaAsP active layer 5 was 12 nm; in other words, (the thickness of the GaAsP active layer 5)×{(the total thickness of the AlGaInP cladding layers 3 and 7)+(the total thickness of the InGaP guide layers 4 and 6)}=12 nm×2.4 µm 28.8 nm·µm.

As can be seen from comparison between the semiconductor laser device 100A and the semiconductor laser device 100C, the only difference is the thickness of the GaAsP active layer 5.

Figure 7:
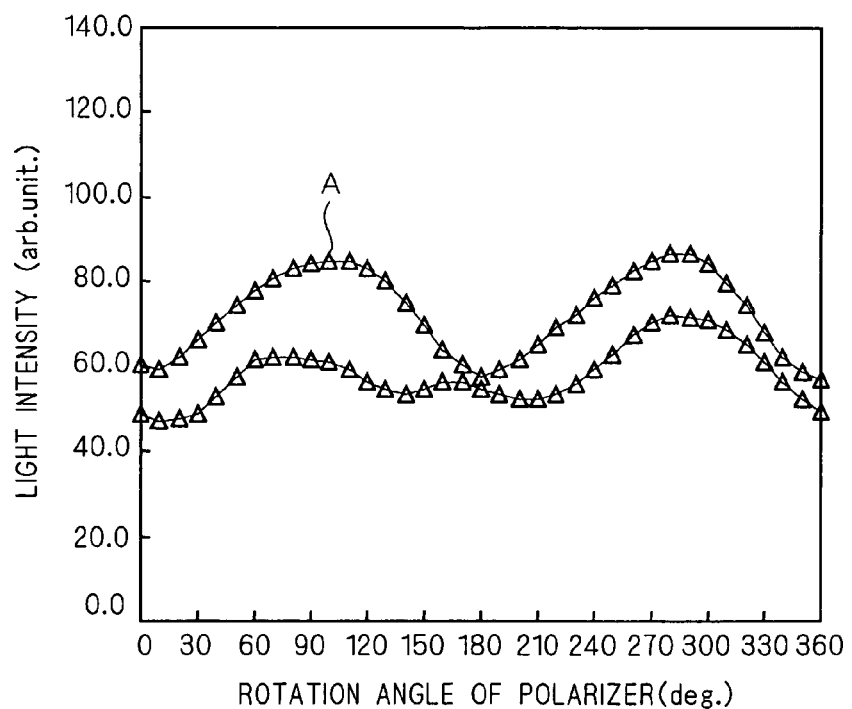

A current of 500 mA was applied to the semiconductor laser device 100C having the layers of the thicknesses shown above, and the polarization characteristic was measured to obtain the results shown in FIG. 7.

In FIG. 7, the vertical axis shows the light intensity (arb. unit) and the horizontal axis shows the rotation angle of the polarizer (deg). As shown in FIG. 7, the measurements were taken at intervals of 10° over rotation angles from 0° to 360° of the polarizer 102. The experiment was conducted using two semiconductor laser devices 100C.

As can be seen from the results shown in FIG. 7, there is little difference between the peak light intensities and bottom light intensities in the light emitted from the semiconductor laser devices 100C. This shows that the light emitted from the semiconductor laser devices 100C is in a no-polarization state in which the TE-polarized component and TM-polarized component are at equal ratios, or in which the TM-polarized component is somewhat larger than the TE-polarized component.

Now, with the data A shown in the experimental data of FIG. 7, the difference between the light intensity peak and the light intensity bottom is 20 arb. unit. However, the value is within the range of measurement error and the light emitted from the semiconductor laser device 100C can be regarded as being sufficiently in a no-polarization state.

When light beams oscillated by the semiconductor laser devices 100A to 100C were passed into rods and optical fibers specially adapted for the TE polarization, almost no deterioration of excitation efficiency was observed. That is, it can be said that the semiconductor laser devices 100A to 100C are semiconductor laser devices that are capable of oscillating light having such high TE-polarized light intensity as to be suitable for practical use.

Now, experiments were conducted in the manner described above with layers having varied thicknesses, and the experimental data shown below, which seems to be on a threshold, was obtained with a semiconductor laser device 100X having layers of the thicknesses below.

That is, an experiment was conducted with a semiconductor laser device 100X with the AlGaInP cladding layers 3 and 7 each having a thickness of 1.0 μm (a total thickness of 2.0 μm), with the InGaP guide layers 4 and 6 each having a thickness of 0.5 μm (a total thickness of 1.0 μm), and with the GaAsP active layer 5 having a thickness of 12 nm.

That is to say, in the experiment on the semiconductor laser device 100X, the sum of the total thickness of the AlGaInP cladding layers 3 and 7 and the total thickness of the InGaP guide layers 4 and 6 was 3.0 μm and the thickness of the GaAsP active layer 5 was 12 nm; in other words, (the thickness of the GaAsP active layer 5)×{(the total thickness of the AlGaInP cladding layers 3 and 7)+(the total thickness of the InGaP guide layers 4 and 6)}=12 nm×3.0 μm=36.0 nm·μm.

A current of 500 mA was applied to the semiconductor laser device 100X having the layers of the thicknesses above, and the polarization characteristic was measured to obtain the results shown in FIG. 8. The experimental data shown in FIG. 8 can be evaluated in the same manner as the data of FIGS. 5 to 7.

As can be seen from the results shown in FIG. 8, the intensities of light emitted from the semiconductor laser devices 100X become maximum when the rotation angle of the polarizer 102 is 70° and 250°. That is, the light intensities exhibit maximum values in the vicinities of 90° or 270°. This shows that the light emitted from the semiconductor laser devices 100X contains a TM-polarized component that is larger than other polarized components (particularly, than the TE-polarized component).

When light oscillated by the semiconductor laser device 100X was passed into a rod or optical fiber specially adapted for the TE polarization, considerable deterioration of excitation efficiency was observed. That is, it can be said that the light oscillated from the semiconductor laser device 100X does not contain a TE-polarized component to an extent suitable for practical use.

The experimental results above show the following.

Now, a polarization ratio is defined as below as a reference for evaluating the polarization characteristics. That is, the polarization ratio is defined as a ratio of the light intensity exhibited when the rotation angle of the polarizer is 90°(i.e. light intensity of TM-polarized light) with respect to the light intensity exhibited when the rotation angle of the polarizer is 180°(i.e., light intensity of TE-polarized light).

FIG. 9 shows the relation between the polarization ratio (vertical axis) and the thickness of the active layer 5 (horizontal axis) with the semiconductor laser devices 100A to 100C and 100X that gave the experimental results shown in FIGS. 5 to 8.

The solid line in FIG. 9 is an approximate line that is obtained from the experimental data about the semiconductor laser devices 100A to 100C (FIGS. 5 to 7). In other words, as can be seen from the thicknesses of the layers, the approximate line is obtained from the experimental data about the semiconductor laser devices 100A to 100C in which the sum of the total thickness of the AlGaInP cladding layers 3 and 7 and the total thickness of the InGaP guide layers 4 and 6 is 2.4 μm.

The dotted line in FIG. 9 is an approximate line that is obtained from the experimental data about the semiconductor laser device 100X (FIG. 8). In other words, as can be seen from the thicknesses of the layers, the approximate line is obtained from the experimental data about the semiconductor laser device 100X in which the sum of the total thickness of the AlGaInP cladding layers 3 and 7 and the total thickness of the InGaP guide layers 4 and 6 is 3.0 μm.

As is known from examinations on the data of FIGS. 5 to 8, the black points in FIG. 9 show the data obtained in a no-polarization state or obtained when the TE-polarized component is larger than the TM-polarized component (i.e., as mentioned above, data obtained from semiconductor laser devices having practicability). On the other hand, the white points in FIG. 9 show the data obtained when the TE-polarized component is much smaller than the TM-polarized component (i.e., as mentioned above, data obtained from semiconductor laser devices having poor practicability, or from semiconductor laser devices that exhibited threshold experimental results).

As can be seen from the results shown in FIG. 9, whether a semiconductor laser device is practical or not is judged according to whether the polarization ratio is less than 2.3 or not (that is, it is judged whether a semiconductor laser device is capable or incapable of oscillating light that contains such a large TE-polarized component as to be suitable for practical use).

Thus, by considering the experimental data shown in FIGS. 5 to 8 and the results shown in FIG. 9, it can be said that a semiconductor laser device 100 having a polarization ratio of less than 2.3 is a semiconductor laser device that is capable of oscillating light that contains such a large TE-polarized component as to be suitable for practical use.

Also, considering the data of FIG. 9 shows the following.

For example, it is known from FIG. 9 that, when the sum of the total thickness of the AlGaInP cladding layers 3 and 7 and the total thickness of the InGaP guide layers 4 and 6 is 2.4 μm, the polarization ratio is 2.3 or more when the thickness of the GaAsP active layer 5 is about 16.5 nm or more.

That is to say, it is known that the polarization ratio is 2.3 or more when (the thickness of the GaAsP active layer 5)×{(the total thickness of the AlGaInP cladding layers 3 and 7)+(the total thickness of the InGaP guide layers 4 and 6)}=16.5 nm×2.4 μm=39.6 nm·μm or more.

On the other hand, for example, when the sum of the total thickness of the AlGaInP cladding layers 3 and 7 and the total thickness of the InGaP guide layers 4 and 6 is 3.0 μm, it is known from FIG. 9 that the polarization ratio is 2.3 or more when the thickness of the GaAsP active layer 5 is about 12 nm or more.

That is to say, it is known that the polarization ratio is 2.3 or more when (the thickness of the GaAsP active layer 5)×{(the total thickness of the AlGaInP cladding layers 3 and 7)+(the total thickness of the InGaP guide layers 4 and 6)}=12 nm×3.0 μm=36.0 nm·μm or more.

Also, the results below were obtained by considering the data of FIG. 9 and by making examinations with varied other layer thicknesses.

That is to say, in the semiconductor laser device 100 constructed as shown in FIG. 1, whether the polarization ratio is less than 2.3 can be judged according to the value of (the thickness of the GaAsP active layer 5)×{(the total thickness of the AlGaInP cladding layers 3 and 7)+(the total thickness of the InGaP guide layers 4 and 6)}.

From the experimental results including those of FIG. 9, it was certainly determined that the polarization ratio is less than 2.3 when the value of (the thickness of the GaAsP active layer 5)×{(the total thickness of the AlGaInP cladding layers 3 and 7)+(the total thickness of the InGaP guide layers 4 and 6)} is less than 36.0 nm·μm.

When the relation holds, that is, when (the thickness of the GaAsP active layer 5)×{(the total thickness of the AlGaInP cladding layers 3 and 7)+(the total thickness of the InGaP guide layers 4 and 6)} is less than 36.0 nm·μm, then the thickness of the GaAsP active layer 5, the thicknesses of the AlGaInP cladding layers 3 and 7, and the thicknesses of the InGaP guide layers 4 and 6 can be adjusted arbitrarily.

For example, when (the total thickness of the AlGaInP cladding layers 3 and 7)+(the total thickness of the InGaP guide layers 4 and 6) is made smaller, then the critical thickness of the GaAsP active layer 5 for obtaining a polarization ratio of less than 2.3 can be made larger (i.e., the critical thickness of the GaAsP active layer 5 with which the relational expression above gives a value less than 36.0 nm·μm can be made larger).

On the other hand, when the value of (the total thickness of the AlGaInP cladding layers 3 and 7)+(the total thickness of the InGaP guide layers 4 and 6) is made larger, then the critical thickness of the GaAsP active layer 5 for obtaining a polarization ratio of less than 2.3 has to be made smaller (i.e., the critical thickness of the GaAsP active layer 5 with which the relational expression above gives a value less than 36.0 nm·μm has to be made smaller).

Now, it is thought that the thicknesses of the AlGaInP cladding layers 3 and 7 and the thicknesses of the InGaP guide layers 4 and 6 are in the order of μm and the thickness of the GaAsP active layer 5 is in the order of nm because of the reason below.

The lattice constant of the GaAsP active layer 5 is smaller than the lattice constant of the GaAs substrate 2. On the other hand, the InGaP guide layers 4 and 6 and the AlGaInP cladding layers 3 and 7 have lattice constants similar to that of the GaAs substrate 2. However, strictly speaking, the lattice constants of the InGaP guide layers 4 and 6 and the AlGaInP cladding layers 3 and 7 are larger than the lattice constant of the GaAs substrate 2.

According to the strained quantum well growth described in the Non-Patent Document 2, when the lattice constant of grown crystal is smaller than the lattice constant of the substrate, the thickness of the crystal grown on the substrate is smaller. On the other hand, when the lattice constant of the grown crystal is approximately equal to the lattice constant of the substrate, the thickness of the crystal grown on the substrate is larger. The orders of thicknesses of the layers reflect this.

In this way, when the polarization ratio is less than 2.3 in the semiconductor laser device 100 of the preferred embodiment shown in FIG. 1, the semiconductor laser device 100 is capable of oscillating light that contains such a large TE-polarized component as to be suitable for practical use (i.e., light with high TE-polarized fight intensity).

Also, in the semiconductor laser device 100 constructed as shown in FIG. 1, the value of the polarization ratio of the semiconductor laser device 100 is certainly less than 2.3 when (the thickness of the GaAsP active layer 5)×{(the total thickness of the AlGaInP cladding layers 3 and 7)+(the total thickness of the InGaP guide layers 4 and 6)} is less than 36.0 nm·μm.

As mentioned above, the thicknesses of the layers 3 to 7 can be arbitrarily determined as long as (the thickness of the GaAsP active layer 5)×{(the total thickness of the AlGaInP cladding layers 3 and 7)+(the total thickness of the InGaP guide layers 4 and 6)} is less than 36.0 nm·μm.

The semiconductor laser device 100 of this preferred embodiment has the GaAsP active layer 5 that does not contain Al (Aluminum). Accordingly, unlike an Al-containing active layer, the GaAsP active layer 5 is free from problems caused by, e.g., oxidation of Al (e.g., lack of long-term operational stability).

Also, from results of theoretical calculations, it is desired that the total thickness of the AlGaInP cladding layers 3 and 7 be 1.0 μm or more.

When the total thickness of the AlGaInP cladding layers 3 and 7 is less than 1.0 μm, the threshold current of laser oscillation greatly increases and the laser oscillation efficiency is lowered. This phenomenon occurs for the reason below.

When the total thickness of the AlGaInP cladding layers 3 and 7 is as small as less than 1.0 μm, the light intensity cannot be sufficiently attenuated in the AlGaInP cladding layers 3 and 7. Then, part of the light reaches the GaAs substrate 2 and the GaAs contact layer 8, and is absorbed in the GaAs substrate 2 and the GaAs contact layer 8. Accordingly, in a semiconductor laser device in which the total thickness of the AlGaInP cladding layers 3 and 7 is less than 1.0 μm, the threshold current of laser oscillation greatly increases and the laser oscillation efficiency is lowered.

As long as the total thickness of the AlGaInP cladding layers 3 and 7 is 1.0 μm or more, the thickness of the AlGaInP cladding layer 3 and the thickness of the AlGaInP cladding layer 7 do not necessarily have to be the same.

Also, from results of theoretical calculations, it is desired that the total thickness of the InGaP guide layers 4 and 6 be 2.0 μm or less.

When the total thickness of the InGaP guide layers 4 and 6 exceeds 2.0 μm, the threshold current of laser oscillation greatly increases. This phenomenon occurs for the reason below.

When the total thickness of the InGaP guide layers 4 and 6 is as large as over 2.0 μm, the light intensity distribution width of near-field pattern expands. This reduces the overlap of the region of the GaAsP active layer 5 and the light intensity distribution of near-field pattern. Accordingly, when the total thickness of the InGaP guide layers 4 and 6 exceeds 2.0 μm in the semiconductor laser device, the laser oscillation threshold current increases.

As long as the total thickness of the InGaP guide layers 4 and 6 is 2.0 μm or less, the thickness of the InGaP guide layer 4 and the thickness of the InGaP guide layer 6 do not necessarily have to be the same.

Also, from results of theoretical calculations, it is desired that the total thickness of the InGaP guide layers 4 and 6 be 0.8 μm or more.

When the total thickness of the InGaP guide layers 4 and 6 is less than 0.8 μm, it is difficult to cause the laser beam to enter an YAG rod etc. This is because, when the total thickness of the InGaP guide layers 4 and 6 is as small as less than 0.8 μm, the optical confinement in the guide layers becomes stronger and the beam width expands.

As long as the total thickness of the InGaP guide layers 4 and 6 is 0.8 μm or more, the thickness of the InGaP guide layer 4 and the thickness of the InGaP guide layer 6 do not necessarily have to be the same.

It is also desired that the thickness of the GaAsP active layer 5 be not less than 5 nm nor more than 12 nm, and that the composition ratio of the GaAsP active layer 5 be As:P=9:1. Adopting such a GaAsP active layer 5 allows the semiconductor laser device 100 to oscillate light in the wavelength range of 780 nm to 820 nm.

Light in this wavelength range is most suitable as excitation light sources for solid-state lasers, such as Nd:YAG and Nd:YLF, which enhances the practicability of the semiconductor laser device 100.

Also, in the semiconductor laser device 100 of this preferred embodiment, it is desired that the surface orientation of the GaAs substrate 2 have an off-angle of approximately 10° with respect to the (100) plane.

The use of the GaAs substrate 2 having such an off-angle improves the crystallinity of the AlGaInP cladding layers 3 and 7, the InGaP guide layers 4 and 6, and the GaAsP active layer 5. Also, improving the crystallinity further lowers the threshold current in laser oscillation.

The semiconductor laser device 100 of this preferred embodiment shows a single quantum well structure that includes a single GaAsP active layer 5. However, this is not a limitation and the structure may be a multiple quantum well structure that includes, e.g., two or three GaAsP active layers 5. In the case of such a multiple quantum well structure, the total sum of thicknesses is used as the thickness of the GaAsP active layer 5 in the calculation shown above.

Also, the AlGaInP cladding layers 3 and 7 and the InGaP guide layers 4 and 6 may be formed in other manners. For instance, while the structure described above includes a single AlGaInP cladding layer 3 and a single InGaP guide layer 4, the structure may include a plurality of such layers. In this case, too, the total sums of thicknesses are used as the thickness of the AlGaInP cladding layers 3 and 7 and the thickness of the InGaP guide layers 4 and 6 in the calculation described above.

Second Preferred Embodiment

Figure 10:
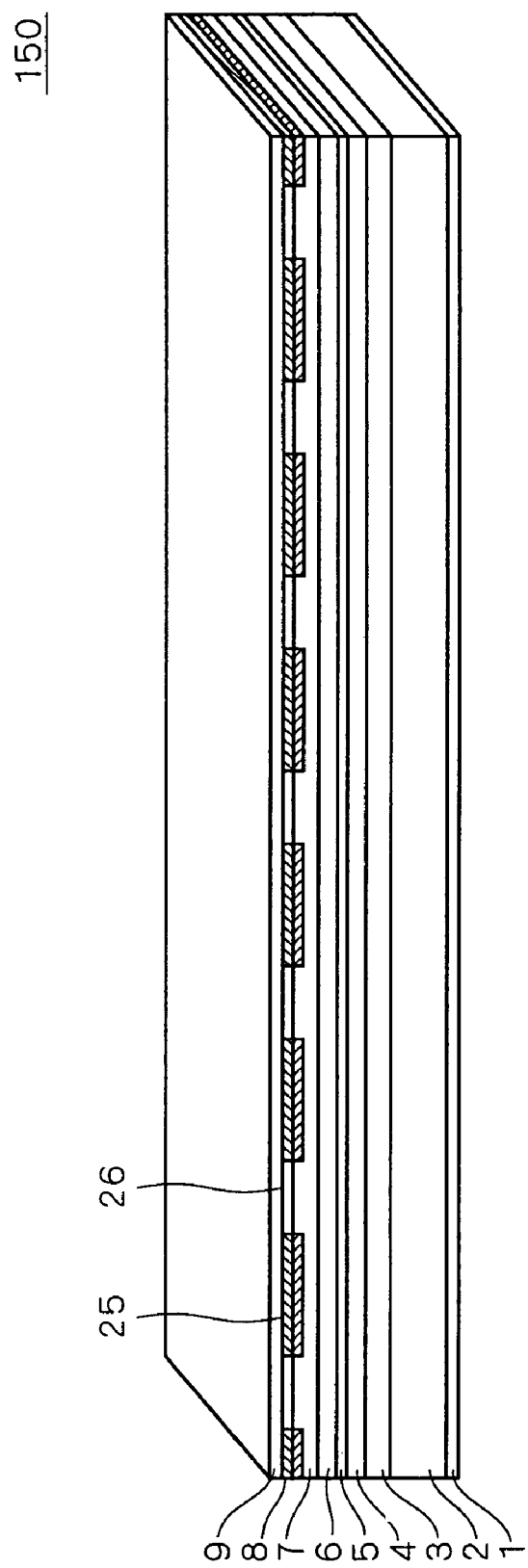
FIGS. 10 and 11 are cross-sectional perspective views illustrating the structure of a semiconductor laser device according to a second preferred embodiment.
Figure 11:
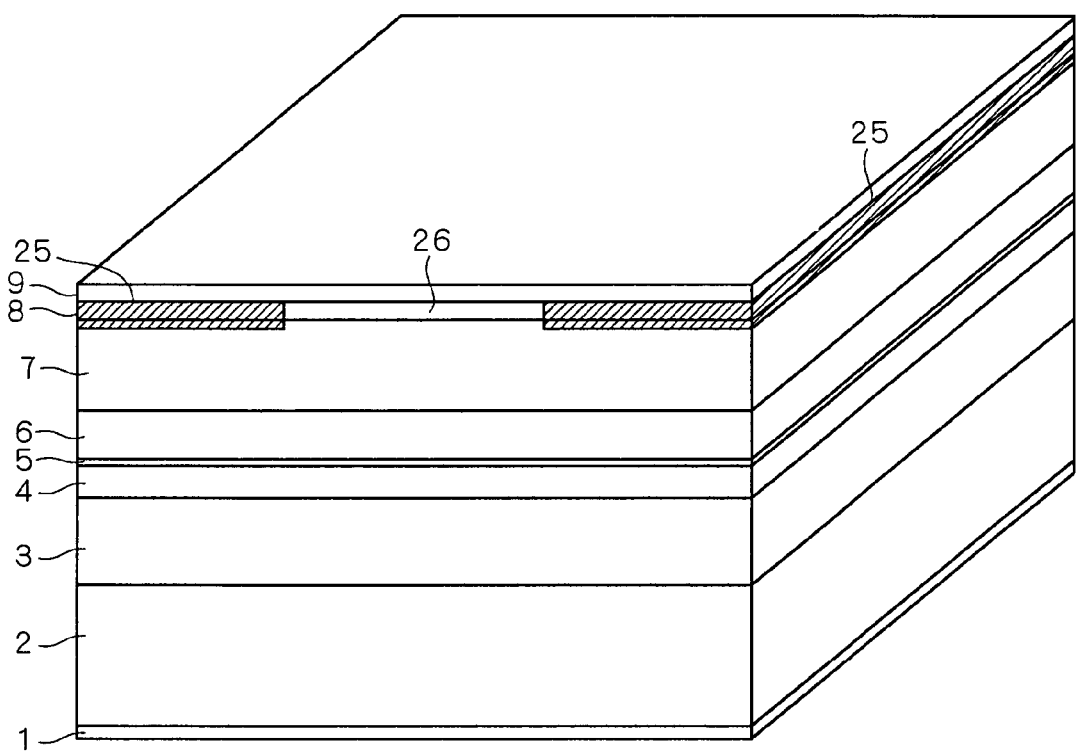

FIG. 10 is a cross-sectional perspective view illustrating the structure of a semiconductor laser device according to a second preferred embodiment. FIG. 11 is a cross-sectional perspective view showing part of the structure of FIG. 10. Specifically, FIG. 10 shows a seven-point-array semiconductor laser device 150 and FIG. 11 shows the structure of one array in an enlarged manner.

The semiconductor laser device 150 of this preferred embodiment has the same structure as the semiconductor laser device 100 of the first preferred embodiment except in the following point.

That is to say, in the semiconductor laser device 150 of this preferred embodiment, protons are implanted in the p-type GaAs contact layer 8 that is formed between the p-type AlGaInP cladding layer 7 and the p-electrode 9.

As shown in FIGS. 10 and 11, regions that are implanted with protons (proton-implanted regions 25) are formed at given intervals in the horizontal direction from the surface of the GaAs contact layer 8 to a given depth in the AlGaInP cladding layer 7.

In FIGS. 10 and 11, the regions that are not implanted with protons (non-proton-implanted regions 26) emit light.

In other respects, the structure is the same as that of the semiconductor laser device 100 of the first preferred embodiment and is not described here again.

The semiconductor laser device 150 of this preferred embodiment, having the proton-implanted regions 25 formed in the surface of the GaAs contact layer 8, offers the effects shown below, as compared with a semiconductor laser device of the structure shown in FIG. 12.

Figure 12:
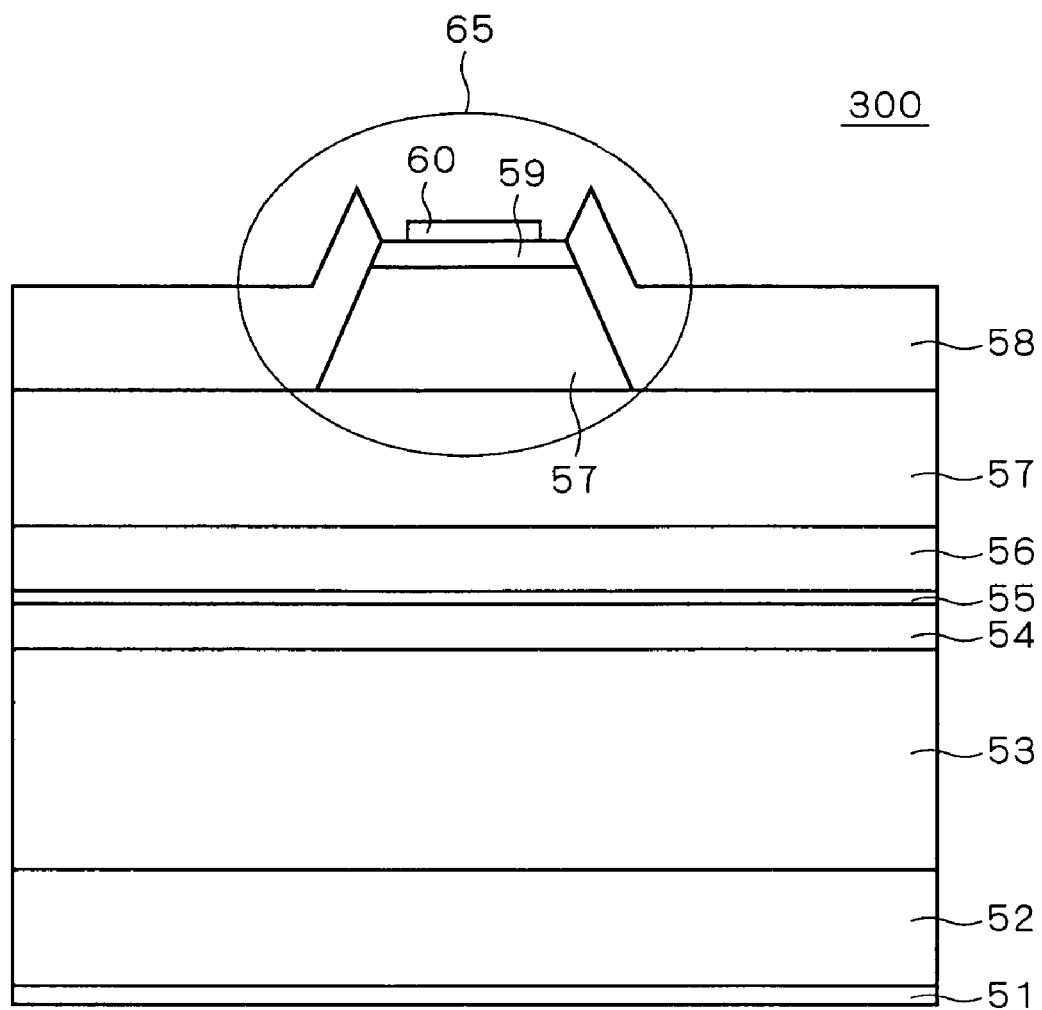
FIG. 12 is a cross-sectional view showing the structure of a semiconductor laser device having current confining layers and a ridge portion.

Now, as shown in FIG. 12, the semiconductor laser device 300 includes an n-electrode 51, an n-type GaAs substrate 52, an n-type AlGaAs cladding layer 53, an AlGaInP guide layer 54, a GaAsP active layer 55, an AlGaInP guide layer 56, a p-type AlGaAs cladding layer 57, n-type GaAs current confining layers 58, a p-type GaAs contact layer 59, and a p-electrode 60.

The proton-implanted regions 25 exhibit higher electric resistance than the non-proton-implanted regions 26. This is because protons serve to increase the electric resistance of the implanted regions.

Accordingly, while the proton-implanted regions 25 are formed at given intervals, the current from the p-electrode 9 flows in the non-proton-implanted regions 26 between the proton-implanted regions 25 (i.e., the current does not flow in the proton-implanted regions 25). Therefore, the semiconductor laser device 150 is capable of achieving desired current confinement without the need for the formation of the current confining layers 58 for current confinement as shown in FIG. 12.

Also, the formation of the current confining layers 58 shown in FIG. 12 requires processes such as etching and crystal growth. However, the semiconductor laser device 150 of this preferred embodiment eliminates the need of such processes.

Thus, the semiconductor laser device 150 of this preferred embodiment allows easier manufacture and reduced manufacturing costs as compared with the semiconductor laser device having the current confining layers 58.

Furthermore, as can be seen from FIG. 12, the semiconductor laser device 300 having the current confining layers 58 requires formation of a raised ridge portion 65. Accordingly, in the semiconductor laser device 300 shown in FIG. 12, the surface having the ridge portion 65 is not flat (i.e., not a single plane).

This configuration causes problems such as stress concentration in the vicinity of the ridge portion 65 and poor bonding strength in junction down mounting.

The junction down mounting is a mounting method in which the PN junction portion formed in the active layer is placed close to the sub-mount substrate and heat sink. As can be seen from the structure shown in FIG. 1 etc., the semiconductor laser device has a part that includes the extremely thick substrate 2 on one side of the active layer and a part that is differently structured on the other side. Then, in the junction down mounting, the side in which the substrate 2 is absent is put on the sub-mount substrate.

The semiconductor laser device 150 of this preferred embodiment does not have a ridge portion and the surface of the semiconductor laser device 150 (particularly, the surface on which the p-electrode 9 resides) forms a single plane. This avoids such stress concentration as mentioned above.

Figure 13:
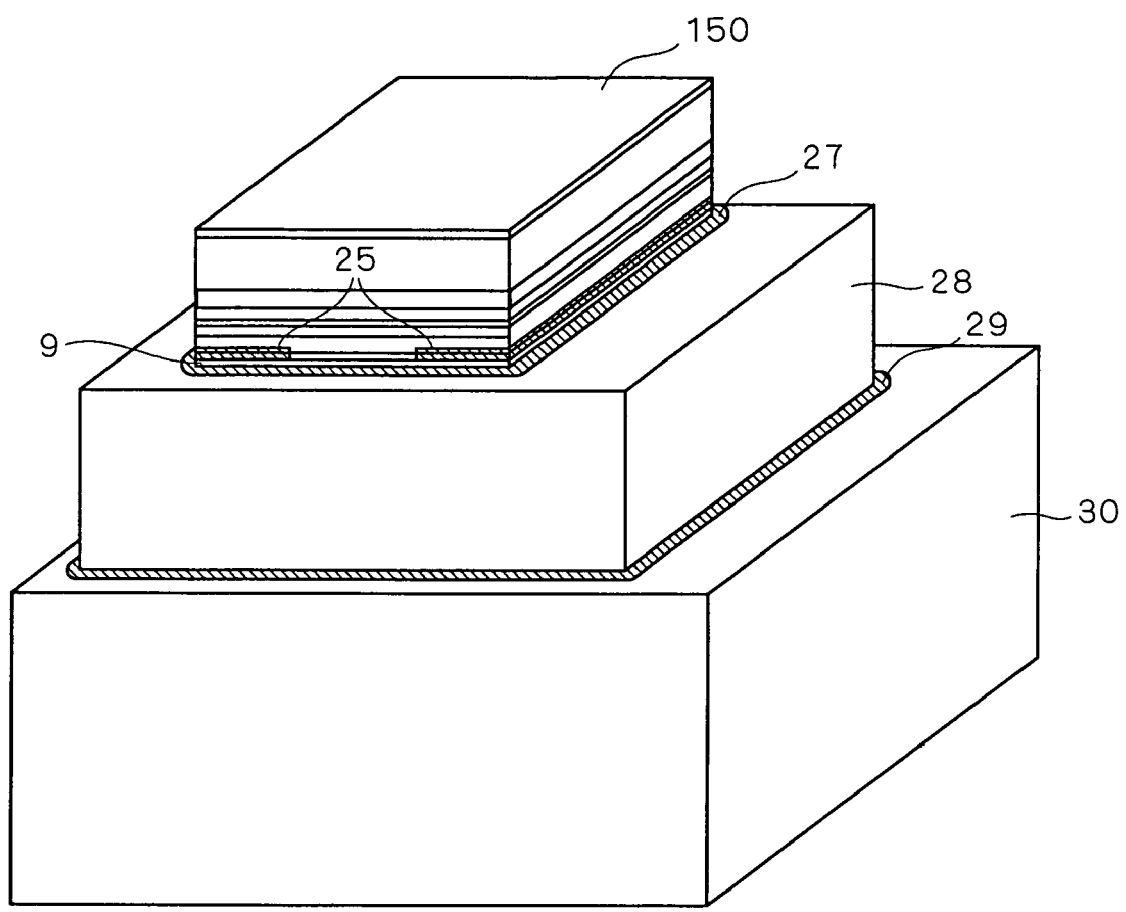
FIG. 13 is a diagram showing the semiconductor laser device of the second preferred embodiment being mounted in a junction-down manner.

Also, as shown in FIG. 13, suppose that the semiconductor laser device 150 of this preferred embodiment is junction-mounted on a sub-mount substrate 28 with solder 27 applied therebetween. The surface of the semiconductor laser device 150 where the p-electrode 9 resides is a flat plane. Accordingly, when the semiconductor laser device 150 is junction-down-mounted, the bonding strength between the sub-mount substrate 28 and the semiconductor laser device 150 is improved.

In FIG. 13, the p-electrode 9 of the semiconductor laser device 150 is junction-down-mounted on the sub-mount substrate 28 with the solder 27 therebetween. The sub-mount substrate 28 is bonded with solder 29 to a block (heat sink) 30 that chiefly contains copper, silver, or the like.

The proton-implanted regions 25 satisfactorily work when they are formed to a depth somewhat deeper than the thickness of the GaAs contact layer 8. For example, the current confinement is satisfactorily achieved when the proton-implanted regions 25 are formed from the surface of the GaAs contact layer 8 to a depth of about 0.1 μm from the surface of the AlGaInP cladding layer 7.

By the way, the GaAs contact layer 8 satisfactorily achieves its function (ohmic-contact function between the cladding layer 7 and the electrode) even when its thickness is 0.1 μm or less.

Accordingly, the semiconductor laser device 150 of this preferred embodiment further offers the advantage below.

In the structure having the current confining layers 58 as shown in FIG. 12, the thickness of the current confining layers 58 is 1 μm or more. Suppose the semiconductor laser device 300 of this structure is junction-down-mounted. In this case, the long distance from the PN junction portion in the active layer 55 as the heat generating source to the p-electrode 60 bonded to the sub-mount substrate unavoidably causes increased thermal resistance.

By contrast, in the semiconductor laser device 150 of this preferred embodiment, the thickness of the GaAs contact layer 8 having the proton-implanted regions 25 is around 0.1 μm as mentioned above. Also, current confinement is satisfactorily achieved when the proton-implanted regions 25 are formed to a depth of about 0.1 μm from the surface of the AlGaInP cladding layer 7. That is, in the structure of the semiconductor laser device 150, the thickness of the GaAs contact layer 8 is very small and the portion that contributes to current confinement is also very small.

Accordingly, when the semiconductor laser device 150 of this preferred embodiment is junction-down-mounted, the distance from the PN junction portion in the GaAsP active layer 5 as the heat generating source to the p-electrode 9 bonded to the sub-mount substrate 28 is reduced. That is to say, the semiconductor laser device 150 of this preferred embodiment allows reduction of thermal resistance.

FIG. 10 illustrates the seven-point-array semiconductor laser device 150. However, needless to say, the portions serving as light sources are not limited to seven points, but can be more than seven or less than seven.

While the invention has been described in detail, the foregoing description is in all aspects illustrative and not restrictive. It is understood that numerous other modifications and variations can be devised without departing from the scope of the invention.

What is claimed is:

1. A semiconductor laser device comprising:
   a GaAs substrate;
   a GaAsP active layer that emits light and has a thickness;
   first and second InGaP guide layers having respective thicknesses and between which said GaAsP active layer is interposed; and
   first and second AlGaInP cladding layers having respective thicknesses and between which said InGaP guide layers and said GaAsP active layer are interposed, wherein
      said first AlGaInP cladding layer is disposed on said GaAs substrate,
   said semiconductor laser produces light including a TM-polarized light component and a TE-polarized light component, and
   a product produced by multiplying (i) the thickness of said GaAsP active layer by (ii) a sum of thicknesses of said first and second InGaP guide layers and said first and second AlGaInP cladding layers is less than 36.0 nm·μm, whereby polarization ratio, which is a ratio of light intensity of the TM-polarized light component to light intensity of the TE-polarized light component, is greater than 0 and less than 2.3.

2. The semiconductor laser device according to claim 1, wherein total thickness of said first and second AlGaInP cladding layers is at least 1.0 μm.

3. The semiconductor laser device according to claim 1, wherein total thickness of said first and second InGaP guide layers is not more than 2.0 μm.

4. The semiconductor laser device according to claim 1, wherein total thickness of said first and second InGaP guide layers is at least 0.8 μm.

5. The semiconductor laser device according to claim 1, wherein the thickness of said GaAsP active layer is within a range from 5 nm to 12 nm, and composition ratio of said GaAsP active layer is As:P=9:1.

6. The semiconductor laser device according to claim 1, wherein surface orientation of said GaAs substrate is off-angle by approximately 10° with respect to a (100) plane.

7. The semiconductor laser device according to claim 1, further comprising an electrode, a contact layer located between said second AlGaInP cladding layer and said electrode, and regions that are implanted with protons, located at a given interval, along a direction substantially parallel to said second AlGaInP cladding layer, and extending from a surface of said contact layer and into said second AlGaInP cladding layer to a given depth of said second AlGaInP cladding layer.

8. The semiconductor laser device according to claim 7, comprising a sub-mount substrate and a layered structure including said GaAsP active layer, said first and second InGaP guide layers, and said first and second AlGaInP cladding layers, wherein said semiconductor laser device is mounted in a junction down manner on said sub-mount substrate.

* * * * *